(12) United States Patent
Demange

(10) Patent No.: US 10,522,999 B2
(45) Date of Patent: Dec. 31, 2019

(54) CIRCUIT AND METHOD FOR PROTECTING A VOLTAGE REGULATING CIRCUIT AGAINST ELECTROSTATIC DISCHARGES

(71) Applicant: STMicroelectronics (Rousset) SAS, Rousset (FR)

(72) Inventor: Nicolas Demange, Saint-Maximin (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 263 days.

(21) Appl. No.: 15/436,186

(22) Filed: Feb. 17, 2017

(65) Prior Publication Data

US 2018/0041024 A1 Feb. 8, 2018

(30) Foreign Application Priority Data

Aug. 4, 2016 (FR) ...................................... 16 57569

(51) Int. Cl.
| | | |
|---|---|---|
| *H02H 7/00* | (2006.01) | |
| *H02H 9/00* | (2006.01) | |
| *H02H 7/125* | (2006.01) | |
| *H01L 27/02* | (2006.01) | |
| *H02H 7/20* | (2006.01) | |
| *G06K 19/07* | (2006.01) | |
| *G06K 19/077* | (2006.01) | |
| *H02H 9/04* | (2006.01) | |

(52) U.S. Cl.
CPC ....... *H02H 7/1252* (2013.01); *G06K 19/0701* (2013.01); *G06K 19/07735* (2013.01); *H01L 27/0255* (2013.01); *H02H 7/20* (2013.01); *H02H 9/041* (2013.01); *H02H 9/046* (2013.01)

(58) Field of Classification Search
CPC .... H02H 7/20; H02H 7/1252; H01L 27/0255; H01L 27/0288

USPC ...................................................... 361/56, 111
See application file for complete search history.

(56) References Cited

U.S. PATENT DOCUMENTS

| | | | | |
|---|---|---|---|---|
| 8,292,185 B2* | 10/2012 | Ng | ..................... | G06K 19/0723 |
| | | | | 235/476 |
| 2005/0156629 A1* | 7/2005 | Huber | .............. | H03K 19/00315 |
| | | | | 326/81 |
| 2007/0109697 A1 | 5/2007 | Huh | | |

(Continued)

FOREIGN PATENT DOCUMENTS

| | | | |
|---|---|---|---|
| FR | | 2982416 A1 | 5/2013 |
| FR | | 2987496 A1 | 8/2013 |
| WO | WO-2007046015 A1 | | 4/2007 |

OTHER PUBLICATIONS

INPI Search Report and Written Opinion for FR 1657569 dated Apr. 25, 2017 (8 pages).

*Primary Examiner* — Thienvu V Tran
*Assistant Examiner* — Lucy M Thomas
(74) *Attorney, Agent, or Firm* — Crowe & Dunlevy

(57) ABSTRACT

An integrated circuit includes a voltage regulating circuit in the form of only one transistor, or a group of several transistors in parallel, that are connected between first and second terminals configured to be coupled to an antenna. A control circuit operates to make the voltage regulating circuit inactive when a pulse generated by an electrostatic discharge event appears at one of the first and second terminals, regardless of the direction of flow of the pulse between the first and second terminals. An electrostatic discharge circuit is further provided to address the electrostatic discharge event.

15 Claims, 2 Drawing Sheets

(56) References Cited

U.S. PATENT DOCUMENTS

2013/0215808 A1* 8/2013 Muthukrishnan ...... H02H 9/045
  370/297
2013/0258533 A1 10/2013 Chen
2017/0149236 A1* 5/2017 Mallory .................. H02M 7/06

* cited by examiner

CIRCUIT AND METHOD FOR PROTECTING A VOLTAGE REGULATING CIRCUIT AGAINST ELECTROSTATIC DISCHARGES

PRIORITY CLAIM

This application claims the priority benefit of French Application for Patent No. 1657569, filed on Aug. 4, 2016, the disclosure of which is hereby incorporated by reference in its entirety.

TECHNICAL FIELD

Implementations and embodiments herein relate to electronic devices, and notably electronic devices intended to protect components against Electrostatic Discharge (ESD).

BACKGROUND

In the field of microelectronics, electrostatic discharge can occur throughout the life of an integrated circuit, and is a real problem with respect to the reliability of this integrated circuit, as well as a major cause of failure.

In particular, an electrostatic discharge can arise during the fabrication stage for a circuit, when a person charged with static electricity handles the circuit. Upon contact with components, the static electricity discharges from the body of the person into the integrated circuit causing damage.

An electrostatic discharge generally results in a more or less significant and more or less short current peak.

Certain types of integrated circuits, such as, for example, radio-frequency integrated circuits including an antenna, include voltage regulating circuits connected to the terminals of the antenna providing for limiting possible voltage surges that may appear when the circuit is operating normally. Conventionally, these voltage regulating circuits include several transistors which become conducting when the voltage across the terminals of the antenna exceeds a certain threshold. Thus, the impedance at the terminals of the antenna is modified, and the voltage surge is absorbed.

However, it is necessary that these transistors remain blocked when an electrostatic discharge appears, since the currents generated are too high to be able to pass through the transistors without damaging them.

The use of several transistors notably means that one or other of the transistors can be blocked depending on the terminal which receives an electrostatic discharge, thereby providing a symmetric protection of the device.

However, the use of several transistors presents a drawback from the point of view of surface size. It is therefore proposed here to reduce this size.

SUMMARY

According to one aspect, there is proposed an integrated circuit comprising a first terminal and a second terminal, a processing circuit connected between the first and second terminals, a voltage regulating circuit configured to regulate the voltage between the first and second terminals, a protection circuit configured to protect the processing circuit when an electrostatic discharge appears while the integrated circuit is not powered and a control circuit configured to make the voltage regulating circuit inactive when an electrostatic discharge appears while the integrated circuit is not powered.

According to a general feature of this aspect, the voltage regulating circuit includes only one transistor, or a group of several transistors in parallel, that is connected between the first and second terminals.

Furthermore, the control circuit is configured to make the voltage regulation circuit inactive when the electrostatic discharge appears, regardless of the direction of flow of the pulse between the first and second terminals resulting from the electrostatic discharge.

In other words, there is proposed here a circuit having a reduced surface size and the voltage regulating circuit of which is symmetrically protected against electrostatic discharges.

According to one embodiment, the control circuit is connected to the gate of the transistor for the voltage regulating circuit and is configured to connect the gate of the transistor to the second terminal when an electrostatic discharge appears flowing from the first terminal towards the second terminal, and to connect the gate of the transistor to the first terminal when an electrostatic discharge appears flowing from the second terminal towards the first terminal.

Therefore, the gate of the transistor is connected to the terminal of the circuit which does not receive the electrostatic discharge, and which therefore acts as a reference voltage, or equivalent ground, thereby having the effect of blocking operation of the transistor for the voltage regulating circuit.

The protection circuit can include a protection device and a triggering circuit operating to trigger the protection device in the presence of an electrostatic discharge. The control circuit can include a first transistor, a second transistor, a third transistor and a fourth transistor, these four transistors being connected in series with each other between the first and the second terminals. The first transistor has its gate connected to the second terminal and one of its electrodes is connected to the first terminal. The second transistor and the third transistor have their respective gates connected to the triggering circuit and a common electrode connected to the gate of the transistor for the voltage regulating circuit. The fourth transistor has its gate connected to the first terminal and one of its electrodes connected to the second terminal.

The integrated circuit CI can also comprise a comparison circuit configured to activate the voltage regulating circuit in the presence of a voltage surge. A resistance can be mounted in series between the comparison circuit and the gate of the transistor or transistors for the voltage regulating circuit. This has the effect of further improving the effectiveness of the control circuit.

According to a second aspect, there is proposed a contactless device including an integrated circuit as described previously and an antenna connected to the first terminal and to the second terminal.

The device can be a chip card, an identification badge, or be integrated in a wireless communication device, for example a cellular mobile telephone or a tablet.

In an embodiment, an integrated circuit comprises: a first terminal and a second terminal configured to be coupled to an antenna, a voltage regulating circuit coupled between the first and second terminals and having a control terminal, said voltage regulating circuit activated in responsive to a first control signal received at the control terminal to increase an impedance at the first and second terminals; a sensing circuit configured to detect a surge due to an electromagnetic field at said antenna and assert said first control signal; and a control circuit configured to deactivate the voltage regulating circuit during an event of an electrostatic discharge at one of the first and second terminals while the integrated circuit is not powered.

BRIEF DESCRIPTION OF THE DRAWINGS

Other advantages and features of the invention will become clearer upon examining the detailed description of implementations and embodiments, which are not at all limiting, and accompanying drawings in which.

DETAILED DESCRIPTION

Figure 1:
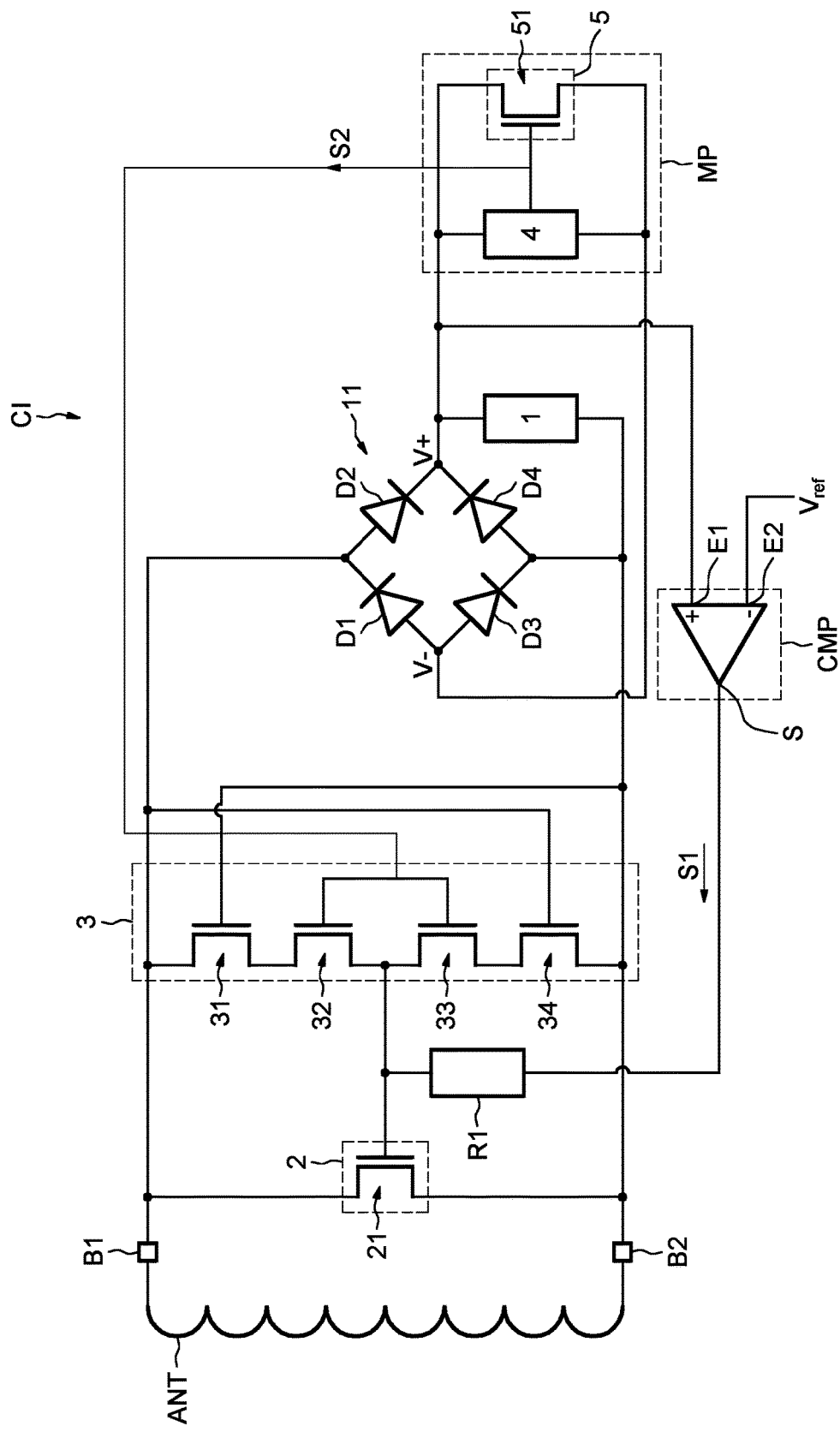
FIG. 1 schematically illustrates an integrated circuit.

FIG. 1 schematically illustrates an example integrated circuit CI from an electrical point of view.

The circuit CI is in this case a radio-frequency identification (RFID) circuit connected to an antenna ANT configured to capture external electromagnetic signals and to convert them by induction into electrical signals.

The antenna ANT is connected to the circuit CI via a first terminal B1 and a second terminal B2.

The integrated circuit CI notably includes a Graetz bridge 11 conventionally including a first diode D1, a second diode D2, a third diode D3 and a fourth diode D4 mounted in a bridge arrangement. The Graetz bridge is conventionally configured to rectify the alternating current induced in the antenna.

The cathodes of the second diode D2 and of the fourth diode D4 are connected to a first bridge terminal V+, and the anodes of the first diode D1 and of the third diode D3 are connected to a second bridge terminal V−. Here, the second bridge terminal V− is a floating ground for the integrated circuit CI in operation.

A processing circuit 1 configured to process the signals captured by the antenna is connected between the first bridge terminal V+ and the second antenna terminal B2. The processing circuit 1 conventionally includes components such as logic circuits and/or a microcontroller.

When the integrated circuit CI is in operation, it is possible that the antenna ANT is subjected to particularly intense electromagnetic fields that are able to generate in the antenna ANT electrical currents, or current surges, capable of damaging the processing circuit 1.

Thus, in order to limit the effects of these current surges, the integrated circuit CI includes a regulating circuit 2 connected between the two antenna terminals B1 and B2. Here, the regulating circuit 2 advantageously comprises a single regulating transistor 21, in this case an NMOS transistor having a first source/drain conduction terminal coupled to terminal B1 and a second source/drain conduction terminal coupled to terminal B2.

It is appropriate to note that FIG. 1 illustrates in this case the regulating transistor 21 schematically. In practice, the regulating transistor 21 can comprise a group of several transistors connected in parallel.

A comparison circuit CMP is connected between the gate of the regulating transistor 21 and the first bridge terminal V+. The comparison circuit CMP is configured to compare the electric potential on the first bridge terminal V+ with a reference potential $V_{ref}$, and, if the potential on the first bridge terminal V+ exceeds the value of the reference potential, to send a first control signal S1 to the gate of the regulating transistor 21 in order to place the regulating transistor in a conducting state. Here, the comparison circuit CMP is implemented by a CMOS comparator conventionally including a first input E1 connected to the first bridge terminal V+, a second input E2 configured to receive the reference potential $V_{ref}$, and an output S connected to the gate of the regulating transistor 21 through resistor R1.

Thus, when the regulating transistor is in a conducting state, the impedance at the terminals of the antenna ANT increases, thereby having the effect of reducing the voltage between the terminals B1 and B2. The components of the processing circuit 1 are therefore protected from voltage surges.

When the integrated circuit CI is not operating, typically during fabrication, it is possible for it to be handled by operators charged with static electricity, causing an electrostatic discharge upon contact with for example the antenna ANT.

In that case, the electrostatic discharge results in a particularly strong current pulse flowing between the terminals B1 and B2.

This can, for example, be referred to as a positive discharge when the discharge takes place from the first terminal B1 towards the second terminal B2 (in this case the second terminal B2 acts as equivalent ground for the circuit CI), and as a negative discharge when the discharge takes place from the second terminal B2 towards the first terminal B1 (in this case the first terminal B1 acts as equivalent ground for the circuit CI).

An electrostatic discharge is differentiated from a conventional current surge by the shorter duration of the electrostatic discharge event, and by the higher intensity of the current generated by the electrostatic discharge event.

It is therefore necessary on the one hand to keep the regulating transistor 21 in a blocked (off) state in order to prevent it from being damaged by the current pulse induced, and on the other hand to divert the current induced by the electrostatic discharge in order that it does not pass through the processing circuit 1.

To this end, the integrated circuit CI further includes a control circuit 3, and a protection circuit MP including a triggering circuit 4 and a protection device 5.

The triggering circuit 4 is configured to detect the appearance of an electrostatic discharge regardless of its direction of flow between the two terminals B1 and B2, and if necessary to send a second control signal S2 to the control circuit 3 and to the protection device 5. The triggering circuit 4 can conventionally comprise a resistive capacitive circuit.

The protection device 5 in this case comprises a protection transistor 51 connected between the first bridge terminal V+ and the second bridge terminal V−, and the gate of which is connected to the triggering circuit 4 to receive the control signal S2. It would also be conceivable to have a protection device 5 comprising thyristors.

It is appropriate to note that in practice, the protection transistor 51 can be a group of a plurality of transistors connected in parallel, and that the protection transistor 51 is much larger than the regulating transistor 21. For example, the regulating transistor 21 has dimensions of the order of a hundred micrometers, while the dimensions of the protection transistor 51 are of the order of a millimeter. The larger size of the protection transistor 51 enables it to withstand high-intensity currents, for example as generated by an electrostatic discharge.

The protection transistor 51 is configured to change to a conducting state when the second control signal S2 is received.

Thus, an electrostatic discharge on one of the terminals B1 or B2, transmitted to the first bridge terminal V+ via the second diode D2 or the fourth diode D4, will be transmitted to the second bridge terminal V− via the protection transistor 51 and will therefore not flow in the processing circuit 1.

The control circuit 3 is configured to connect the gate of the regulating transistor 21 to the second terminal B2 when an electrostatic discharge appears on the first terminal B1, and alternatively to connect the gate of the regulating transistor 21 to the first terminal B1 when an electrostatic discharge appears on the second terminal B2.

The control circuit 3 in this case includes a first NMOS transistor 31, a second NMOS transistor 32, a third NMOS transistor 33 and a fourth NMOS transistor 34, with source-drain paths connected in series between the first terminal B1 and the second terminal B2.

The source-drain path of the first NMOS transistor 31 is connected between the first terminal B1 and the source-drain path of the second transistor 32, the source-drain path of the fourth transistor 34 is connected between the source-drain path of the third transistor 33 and the second terminal B2, and the second NMOS transistor 32 and the third NMOS transistor 33 are mutually coupled by one of their electrodes.

The gate of the first NMOS transistor 31 is connected to the second terminal B2, and the gate of the fourth transistor is connected to the first terminal B1.

The gates of the second NMOS transistor 32 and of the third NMOS transistor 33 are mutually coupled and connected to the triggering circuit 4 so as to be able to receive the second control signal S2.

The mutually coupled electrodes of the second NMOS transistor 32 and of the third NMOS transistor 33 are connected to the gate of the regulating transistor 21.

When a positive electrostatic discharge appears, i.e. in this case flowing from the first terminal B1 towards the second terminal B2, the triggering circuit 4 sends the second control signal S2 to the gate of the second NMOS transistor 32, to the gate of the third NMOS transistor 33 and to the gate of the protection transistor 51.

In response to the second control signal S2, the second and third transistors 32 and 33 change to the conducting state, and because of the high potential on the first terminal B1 due to the electrostatic discharge, the fourth NMOS transistor 34 changes to the conducting state.

The first NMOS transistor 31 has its gate connected to the second terminal B2, which in this case acts as equivalent ground, and therefore remains blocked.

The gate of the regulating transistor 21 therefore ends up connected to the second terminal B2 via the third NMOS transistor 33 and the fourth NMOS transistor 34, and is therefore connected to the equivalent ground of the circuit. The regulating transistor 21 is therefore in a blocked state.

If the electrostatic discharge is negative, i.e. in this case flowing from the second terminal B2 towards the first terminal B1, the first NMOS transistor 31 is in the conducting state and the fourth NMOS transistor 34 remains blocked. The gate of the regulating transistor 21 is therefore connected to the first terminal B1, which in this case acts as equivalent ground. The regulating transistor 21 is therefore also blocked.

Thus, the use of four transistors is particularly advantageous here. Specifically, the first NMOS transistor 31 and the fourth NMOS transistor 34 provide for selecting the terminal to which to connect the gate of the regulating transistor 21, while the second NMOS transistor 32 and the third NMOS transistor 33, connected to the triggering circuit 4, provide for ensuring that the control circuit 3 is activated only during an electrostatic discharge.

More specifically, when the integrated circuit CI is in operation, the first terminal B1 can be at a non-zero potential. In that case, the fourth transistor 34 becomes conducting. Likewise, the second terminal B2 can be at a non-zero potential and in that case the first transistor 31 becomes conducting.

However, if the potential on the first terminal B1 or on the second terminal B2 does not result from an electrostatic discharge, i.e. if it does not correspond to a pulse and does not have a particularly high value, then the triggering circuit 4 does not send the second control signal S2 to the gates of the second transistor 32 and the third transistor 33 which remain in a blocked state.

Thus, in the absence of electrostatic discharge, the gate of the regulating transistor 21 cannot be connected to one or other of the terminals B1 and B2, and the control circuit 3 therefore cannot be activated.

A resistance R1 has furthermore advantageously been connected between the comparison circuit CMP and the gate of the regulating transistor 21 in order to further improve the effectiveness of the control circuit 3. Specifically, during an electrostatic discharge, parasitic currents may be generated at the output of the comparison circuit CMP. The resistance R1 provides for limiting these currents and therefore for ensuring that the gate of the regulating transistor 21 is definitely at a zero potential when the control circuit 3 is activated.

The electronic circuit CI as described previously and illustrated by FIG. 1 can be incorporated within electronic systems such as radio-frequency identification badges, payment cards, portable smartphones, etc.

Figure 2:
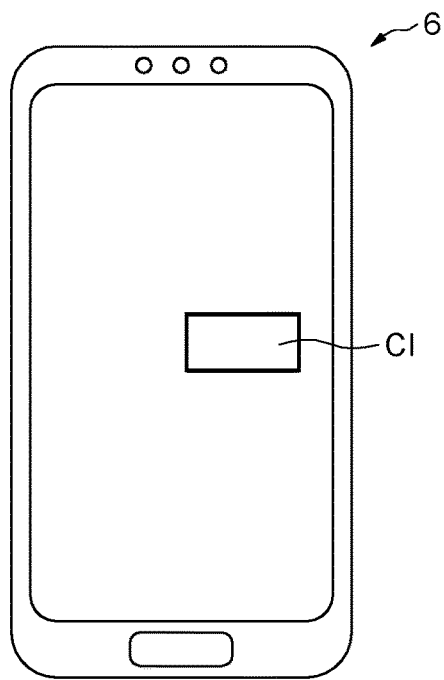
FIGS. 2 to 4 illustrate systems including the integrated circuit of FIG. 1.
Figure 3:
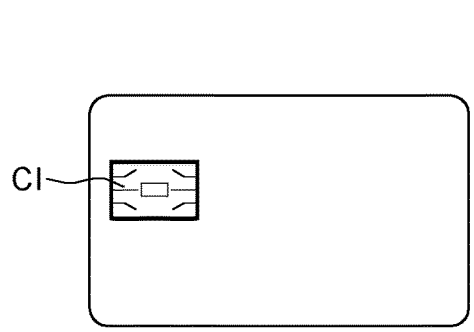
Figure 4:
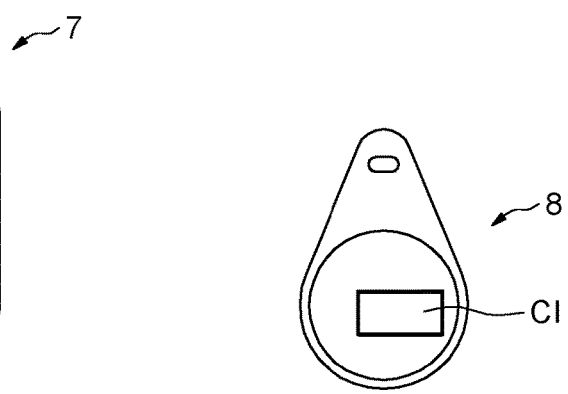

FIGS. 2 to 4 illustrate systems including an electronic circuit as described previously and illustrated in FIG. 1.

FIG. 2 illustrates a portable smartphone 6 including an integrated radio-frequency identification circuit CI as described previously.

FIG. 3 illustrates a chip card 7 enabling "contactless" payments, the chip card including an integrated circuit CI as described previously.

FIG. 4 illustrates a radio-frequency identification badge 8, conventionally configured to allow access to secure premises by passing the badge close to a reading device (not represented). The radio-frequency identification badge 8 includes an electronic circuit CI as described previously.

The invention claimed is:
1. An integrated circuit, comprising:
a first terminal and a second terminal configured to be coupled to an antenna,
a rectification circuit having inputs coupled to the first and second terminals and having an output,
a processing circuit coupled to said output,
a voltage regulating circuit configured to regulate a voltage between the first and second terminals, wherein the voltage regulating circuit includes only one transistor, or a group of several transistors in parallel, connected between the first and second terminals,
a protection circuit configured to protect the processing circuit in the event of an electrostatic discharge while the integrated circuit is not powered,
wherein the protection circuit includes a protection device and a triggering circuit configured to trigger the protection device in the event of the electrostatic discharge, and
a control circuit configured to make the voltage regulating circuit inactive during the event of the electrostatic discharge while the integrated circuit is not powered regardless of a direction of flow of a pulse between the first and second terminals resulting from said event of the electrostatic discharge, wherein the control circuit includes a first transistor, a second transistor, a third transistor, and a fourth transistor, wherein the first through fourth transistors are connected in series between the first and the second terminals, the first transistor having a gate connected to the second terminal and an electrode connected to the first terminal, the second transistor and the third transistor having respective gates connected to the triggering circuit and a common electrode connected to the gate of the only one transistor, or group of several transistors in parallel, of the voltage regulating circuit, and the fourth transistor having a gate connected to the first terminal and an electrode connected to the second terminal.

2. The integrated circuit according to claim 1, wherein the control circuit is connected to a gate of the only one transistor, or group of several transistors in parallel, of the voltage regulating circuit and is configured to:

connect said gate to the second terminal when the flow of the pulse from said event of the electrostatic discharge is from the first terminal towards the second terminal, and connect said gate to the first terminal when the flow of the pulse from said event of the electrostatic discharge is from the second terminal towards the first terminal.

3. The integrated circuit according to claim 1, further comprising:

a comparison circuit configured to activate the voltage regulating circuit in response to a voltage surge at the first and second terminals, and a resistance connected in series between an output of the comparison circuit and the gate of the only one transistor, or group of several transistors in parallel, of the voltage regulating circuit.

4. A device, comprising:

an integrated circuit, comprising:
a first terminal and a second terminal,
a rectification circuit having inputs coupled to the first and second terminals and having an output,
a processing circuit coupled to said output,
a voltage regulating circuit configured to regulate a voltage between the first and second terminals, wherein the voltage regulating circuit includes only one transistor, or a group of several transistors in parallel, connected between the first and second terminals,
a protection circuit configured to protect the processing circuit in the event of an electrostatic discharge while the integrated circuit is not powered, and
a control circuit configured to make the voltage regulating circuit inactive during the event of the electrostatic discharge while the integrated circuit is not powered regardless of a direction of flow of a pulse between the first and second terminals resulting from said event of the electrostatic discharge,
wherein the control circuit includes a first transistor, a second transistor, a third transistor, and a fourth transistor, wherein the first through fourth transistors are connected in series between the first and the second terminals, the first transistor having a gate connected to the second terminal and an electrode connected to the first terminal, the second transistor and the third transistor having respective gates connected to the triggering circuit and a common electrode connected to the gate of the only one transistor, or group of several transistors in parallel, of the voltage regulating circuit, and the fourth transistor having a gate connected to the first terminal and an electrode connected to the second terminal; and an antenna connected to the first terminal and to the second terminal.

5. The device according to claim 4, wherein the device is one of a chip card, a radio-frequency identification badge or a wireless communication device.

6. An integrated circuit, comprising:
a first terminal and a second terminal configured to be coupled to an antenna,
a rectification circuit having inputs coupled to the first and second terminals and having an output,
an overvoltage sensing circuit configured to detect an overvoltage condition at the output of the rectification circuit and assert a first control signal,
a voltage regulating circuit coupled between the first and second terminals and having a first control terminal, said voltage regulating circuit activated in response to said first control signal received at the first control terminal to couple the first and second terminals to each other;
an electrostatic discharge sensing circuit configured to detect a surge condition at the output of the rectification circuit and assert a second control signal;
a discharge circuit coupled to the output of the rectification circuit and having a second control terminal, said discharge circuit activated in response to said second control signal received at the second control terminal, and
a control circuit configured to deactivate the voltage regulating circuit in response to assertion of the second control signal,
wherein the control circuit comprises a first transistor, a second transistor, a third transistor, and a fourth transistor, wherein the first through fourth transistors are connected in series between the first and the second terminals, the first transistor having a gate connected to the second terminal and an electrode connected to the first terminal, the second transistor and the third transistor having respective gates connected to receive the second control signal and a common electrode connected to the first control terminal of the voltage regulating circuit, and the fourth transistor having a gate connected to the first terminal and an electrode connected to the second terminal.

7. The integrated circuit of claim 6, wherein said voltage regulating circuit comprises only one transistor connected between the first and second terminals.

8. The integrated circuit of claim 7, wherein said control circuit connects a gate terminal of said one transistor to the second terminal when the detected surge condition is due to a flow of the electrostatic discharge from the first terminal towards the second terminal.

9. The integrated circuit of claim 7, wherein said control circuit connects a gate terminal of said one transistor to the first terminal when the detected surge condition is due to a flow of the electrostatic discharge from the second terminal towards the first terminal.

10. The integrated circuit of claim 6, wherein said voltage regulating circuit comprises a group of several transistors connected in parallel with each other between the first and second terminals.

11. The integrated circuit of claim 10, wherein said control circuit connects gate terminals of said group of several transistors to the second terminal when the detected surge condition is due to a flow of the electrostatic discharge from the first terminal towards the second terminal.

12. The integrated circuit of claim 10, wherein said control circuit connects gate terminals of said group of several transistors to the first terminal when the detected surge condition is due to a flow of the electrostatic discharge from the second terminal towards the first terminal.

13. An integrated circuit, comprising: a first terminal and a second terminal configured to be coupled to an antenna,
- a rectification circuit having inputs coupled to the first and second terminals and having an output,
- a first transistor having a source terminal coupled to the first terminal, a drain terminal coupled to the second terminal and a first gate terminal,
- a second transistor having one of a source or drain terminal coupled to the output and a second gate terminal,
- an overvoltage detection circuit configured to detect an overvoltage condition at said output of the rectification circuit and in response thereto apply a first voltage to the first gate terminal for turning on the first transistor,
- an electrostatic discharge detection circuit configured to detect a surge in voltage at said output of the rectification circuit and in response thereto apply a second voltage to the second gate terminal for turning on the second transistor, and
- a control circuit configured to respond to the second voltage by applying a voltage at one of the first and second terminals to the first gate terminal for turning off the first transistor,
- wherein the control circuit includes a first transistor, a second transistor, a third transistor, and a fourth transistor, wherein the first through fourth transistors are connected in series between the first and the second terminals, the first transistor having a gate connected to the second terminal and an electrode connected to the first terminal, the second transistor and the third transistor having respective gates connected to receive the second voltage and a common electrode connected to the first gate terminal, and the fourth transistor having a gate connected to the first terminal and an electrode connected to the second terminal.

14. The integrated circuit according to claim 13, wherein the control circuit responds to the second voltage by:
- applying the voltage at the second terminal to the first gate terminal if the detected surge is in response to an electrostatic discharge having a pulse flow from the first terminal towards the second terminal; and
- applying the voltage at the first terminal to the first gate terminal if the detected surge is in response to an electrostatic discharge having a pulse flow from the second terminal towards the first terminal.

15. The integrated circuit according to claim 13,
- wherein the overvoltage detection circuit comprises a comparison circuit configured to compare a voltage at said output of the rectification circuit to a reference voltage and apply the first voltage to the first gate terminal if the voltage exceeds the reference voltage, and
- wherein the electrostatic discharge detection circuit comprises a triggering circuit configured to detect the surge in voltage at said output of the rectification circuit.

* * * * *